(12) United States Patent
Lan et al.

(10) Patent No.: US 11,935,845 B2
(45) Date of Patent: Mar. 19, 2024

(54) SEMICONDUCTOR DEVICE, PREPARATION METHOD THEREFOR AND ELECTRICAL EQUIPMENT THEREOF

(71) Applicants: Guangdong Midea White Home Appliance Technology Innovation Center Co., Ltd., Foshan (CN); Midea Group Co., Ltd., Foshan (CN)

(72) Inventors: Hao Lan, Foshan (CN); Yuxiang Feng, Foshan (CN)

(73) Assignees: Guangdong Midea White Home Appliance Technology Innovation Center Co., Ltd., Foshan (CN); Midea Group Co., Ltd., Foshan (CN)

( * ) Notice: Subject to any disclaimer, the term of this patent is extended or adjusted under 35 U.S.C. 154(b) by 0 days.

(21) Appl. No.: 17/724,416

(22) Filed: Apr. 19, 2022

(65) Prior Publication Data

US 2022/0238462 A1 Jul. 28, 2022

Related U.S. Application Data

(63) Continuation of application No. PCT/CN2019/125342, filed on Dec. 13, 2019.

(30) Foreign Application Priority Data

Oct. 31, 2019 (CN) .......................... 201911054305.X

(51) Int. Cl.
*H01L 29/40* (2006.01)
*H01L 23/64* (2006.01)
(Continued)

(52) U.S. Cl.
CPC .......... *H01L 23/642* (2013.01); *H01L 29/401* (2013.01); *H01L 29/41708* (2013.01); *H01L 29/41741* (2013.01); *H01L 29/41775* (2013.01); *H01L 29/6634* (2013.01); *H01L 29/7398* (2013.01)

(58) Field of Classification Search
CPC ................. H01L 23/642; H01L 29/401; H01L 29/41708; H01L 29/41741;
(Continued)

(56) References Cited

U.S. PATENT DOCUMENTS

| 5,198,995 A | 3/1993 | Dennard et al. |
| 5,428,236 A | 6/1995 | Uchida |

(Continued)

FOREIGN PATENT DOCUMENTS

| CN | 103872037 A | 6/2014 |
| CN | 105074922 A | 11/2015 |

(Continued)

OTHER PUBLICATIONS

Midea Group Co., Ltd., Extended European Search Report and Supplementary Search Report, EP19950962.1, dated Oct. 21, 2022, 11 pgs.

(Continued)

*Primary Examiner* — Shahed Ahmed
(74) *Attorney, Agent, or Firm* — Morgan, Lewis & Bockius LLP

(57) ABSTRACT

Disclosed are a semiconductor device, a preparation method therefor and electrical equipment thereof. The semiconductor device includes: a silicon substrate on which an emitter, a gate, and a collector are formed; a bootstrap electrode formed on the silicon substrate; and an insulating layer, formed on the silicon substrate and disposed between the emitter and the bootstrap electrode. A bootstrap capacitor is formed between the emitter and the bootstrap electrode.

15 Claims, 3 Drawing Sheets

(51) Int. Cl.
*H01L 29/417* (2006.01)
*H01L 29/66* (2006.01)
*H01L 29/739* (2006.01)

(58) Field of Classification Search
CPC .......... H01L 29/41775; H01L 29/6634; H01L 29/7398; H01L 29/66181; H01L 29/083; H01L 27/0733; H01L 29/0692; H01L 29/7394; H01L 29/7322; H01L 29/0603; H01L 29/0684; H01L 29/40; H01L 21/8248–8249; H01L 27/0259–0262; H01L 29/0804–0826; H01L 28/90–92; H01L 29/945

See application file for complete search history.

(56) References Cited

U.S. PATENT DOCUMENTS

| | | |
|---|---|---|
| 2005/0280085 A1 | 12/2005 | Babcock et al. |
| 2009/0224302 A1 | 9/2009 | Willmeroth et al. |
| 2015/0364470 A1 | 12/2015 | Yamaj |
| 2016/0056282 A1 | 2/2016 | Yamaj |
| 2017/0229536 A1* | 8/2017 | Stuber .................. H01L 29/36 |
| 2018/0158815 A1* | 6/2018 | Onozawa ............ H01L 27/0629 |

FOREIGN PATENT DOCUMENTS

| | | |
|---|---|---|
| CN | 107910326 A | 4/2018 |
| GB | 2231718 A | 11/1990 |
| JP | S 61251064 A | 11/1986 |
| JP | 2005191835 A | 7/2005 |

OTHER PUBLICATIONS

Midea Group Co., Ltd., WO, PCT/CN2019/125342, Jul. 22, 2020, 3 pgs.
Midea Group Co., Ltd., IPRP, PCT/CN2019/125342, May 3, 2022, 4 pgs.
International Search Report, International application No. PCT/CN2019/125342, dated Jul. 22, 2020, 13 pages.
Chinese first office action application No. 201911054305.X, dated Nov. 30, 2021, 16 pages.

* cited by examiner

SEMICONDUCTOR DEVICE, PREPARATION METHOD THEREFOR AND ELECTRICAL EQUIPMENT THEREOF

CROSS REFERENCE TO RELATED APPLICATIONS

This application is a continuation application of International Application No. PCT/CN2019/125342, filed on Dec. 13, 2019, which claims of the benefit of the Chinese Patent Application No. 201911054305.X, entitled "SEMICONDUCTOR DEVICE, PREPARATION METHOD THEREFOR AND ELECTRICAL EQUIPMENT THEREOF," filed on Oct. 31, 2019, the entire contents of which are hereby incorporated by reference in its entirety.

TECHNICAL FIELD

The present disclosure relates to the field of semiconductor technologies, and in particular to a semiconductor device, a preparation method therefor and an electrical equipment thereof.

BACKGROUND

Semiconductor devices are used in most current circuit structures, and even multiple semiconductor devices in a silicon-substrate-integrated circuit structure can be used. However, at present, multiple semiconductor devices made from a silicon substrate cannot form a complete circuit and may be required to be connected with external electrical components to form a complete circuit. The circuit structure is thus complicated. For example, the IPM module 100 in FIG. 1 may be required to be connected with the bootstrap capacitors 131-133 on the periphery, together with an integrated bootstrap diode to achieve the complete bootstrap function.

SUMMARY OF THE DISCLOSURE

A technical solution adopted in the present disclosure is to provide a semiconductor device, comprising: a silicon substrate, wherein an emitter, a gate, and a collector are formed on the silicon substrate; a bootstrap electrode, formed on the silicon substrate; and an insulating layer, formed on the silicon substrate and disposed between the emitter and the bootstrap electrode; wherein a bootstrap capacitor is formed between the emitter and the bootstrap electrode.

Another technical solution adopted in the present disclosure is to provide an electrical equipment comprising the above-mentioned semiconductor device.

Further another technical solution adopted in the present disclosure is to provide a preparation method for a semiconductor device, comprising:

providing a silicon substrate; and forming an insulating layer, a bootstrap electrode, and an emitter on the silicon substrate;

wherein the insulating layer is disposed between the emitter and the bootstrap electrode, such that a bootstrap capacitor is formed between the emitter and the bootstrap electrode.

DETAILED DESCRIPTION

The technical solutions in the embodiments of the present disclosure will be described clearly and completely in conjunction with the accompanying drawings in the embodiments of the present disclosure. Obviously, the described embodiments are only a part of the embodiments of the present disclosure, rather than all of them. Based on the implementation manners in the present disclosure, all other implementation manners obtained by those skilled in the art without creative work shall fall within the scope of the present disclosure.

It should be noted that when there are directional indications (such as up, down, left, right, front, back . . . ) involved in the implementation of the present disclosure, the directional indication is only intended to explain the relative position relationship, movement, etc. between parts in a particular attitude (as shown in the attached drawings), and if that attitude is changed, the directional indication is changed accordingly.

In addition, when there are descriptions related to "first", "second", etc. in the embodiments of the present disclosure, the descriptions of "first", "second", etc. are only intended for descriptive purposes, and cannot be understood as indicating or implying relative importance or implicitly indicating the number of technical features indicated. Therefore, the features defined with "first" and "second" may explicitly or implicitly include at least one of the features. In addition, the technical solutions between the various embodiments may be combined with each other, but they must be based on what can be achieved by those skilled in the art. When the combination of technical solutions is contradictory or cannot be achieved, it should be considered that such a combination of technical solutions does not exist and is not within the scope claimed in the present disclosure.

Figure 1:
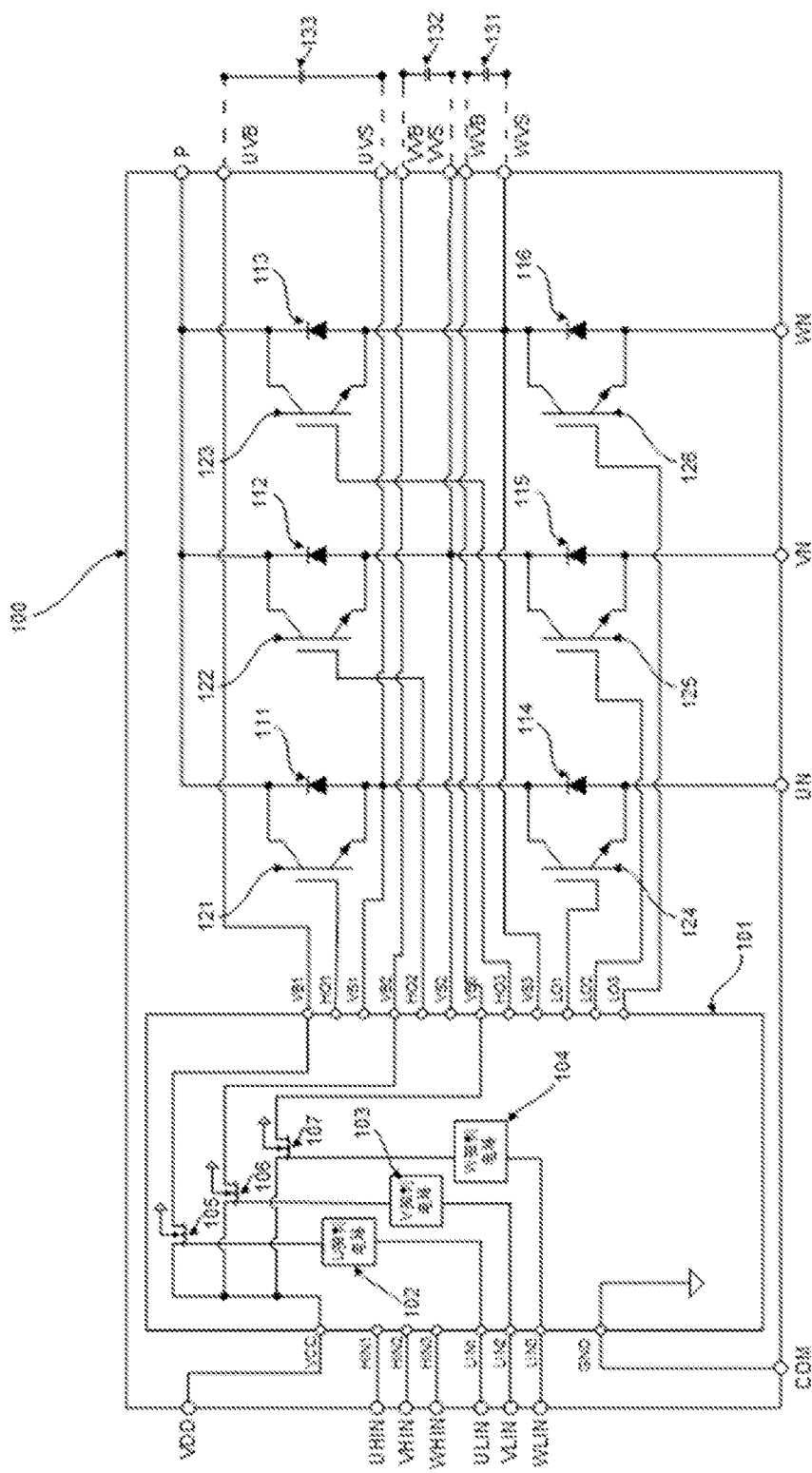
FIG. 1 is a structural schematic view of an external bootstrap capacitor of an IPM module in the related art.
Figure 2:
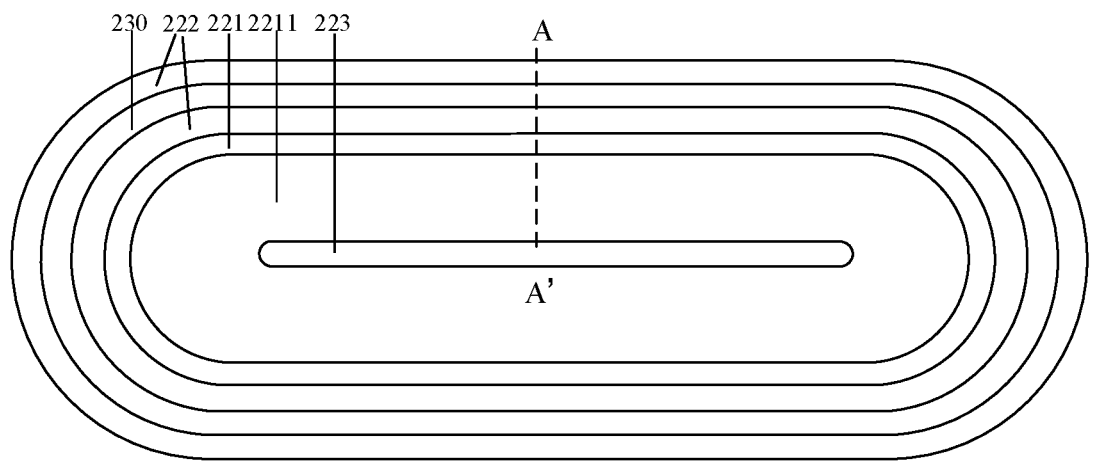
FIG. 2 is a structural schematic view of a semiconductor device according to some embodiments of the present disclosure.
Figure 3:
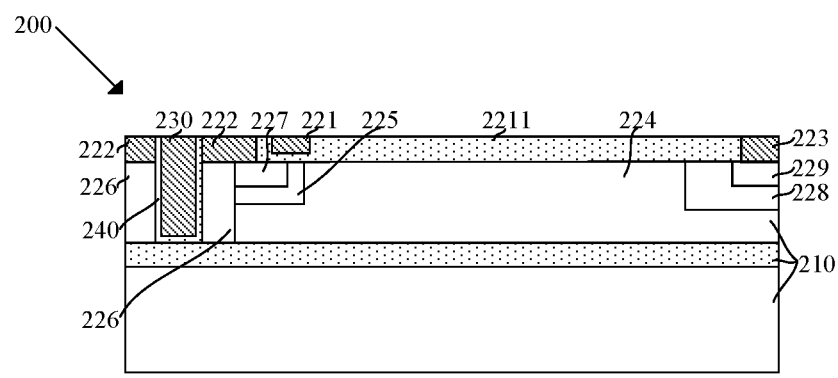
FIG. 3 is a schematic cross-sectional view of the semiconductor device shown in FIG. 2 taken along A-A'.

Referring to FIGS. 2 and 3. FIG. 2 is a structural schematic view of a semiconductor device 200 according to some embodiments of the present disclosure, and FIG. 3 is a schematic cross-sectional view of the semiconductor device 200 shown in FIG. 2 taken along A-A'. As shown in FIGS. 2 and 3, the semiconductor device 200 includes a silicon substrate 210, a bootstrap electrode 230, and an insulating layer 240. An emitter 222, a gate 221, and a collector 223 are formed on the silicon substrate 210. The bootstrap electrode 230 is formed on the silicon substrate 210. The insulating layer 240 is disposed between the emitter 222 and the bootstrap electrode 230, such that a bootstrap capacitor is formed between the emitter 222 and the bootstrap electrode 230.

In some embodiments, the bootstrap electrode 230 is formed on the silicon substrate 210, the emitter 222 and the bootstrap electrode 230 form two poles of the bootstrap capacitor, and the insulating layer 240 formed on the silicon substrate 210 is configured as an insulating medium between the emitter 222 and the bootstrap electrode 230. In this way, the emitter 222, the bootstrap electrode 230, and the insulating layer 240 can form a bootstrap capacitor. Therefore, in some embodiments, the bootstrap capacitor is integrated into the semiconductor device 200, and the semiconductor device 200 is not required to be additionally connected to a bootstrap capacitor in the circuit to simplify the circuit structure.

In some embodiments, the emitter 222 is configured as an end electrode of the bootstrap capacitor. When the potential of the emitter 222 changes, since the voltage across the bootstrap capacitor cannot change suddenly, the potential of the bootstrap electrode 230 varies with the potential of the emitter 222. The voltage between the bootstrap electrode 230 and the emitter 222 is maintained close to a certain voltage, and the bootstrap electrode 230 may drive and supply the gate 221 to realize the bootstrap function.

Among them, the insulating layer 240 may be a silicon dioxide layer, a silicon nitride layer, or other insulating layers. In some embodiments, the insulating layer 240 may be formed by high-temperature oxidation treatment or high-temperature nitridation treatment on a part of the silicon substrate 210 in an oxygen or nitrogen atmosphere.

In some embodiments, the bootstrap electrode 230 may be made of conductive polysilicon or metal.

It can be understood that a transistor structure may be formed on the silicon substrate 210. The transistor structure includes the emitter 222, the gate 221, and the collector 223. The insulating layer 240 may be formed at a junction of the transistor structure and the bootstrap electrode 230, such that the insulating layer 240 can isolate the transistor structure from the bootstrap electrode 230, preventing the realization of the performance of the transistor structure itself from being affected by the presence of the bootstrap electrode 230, which can make the semiconductor device 200 function as both the bootstrap capacitor and the transistor structure, thereby improving the integration degree thereof.

The transistor structure may be an insulated gate bipolar transistor. In other embodiments, the transistor structure may be a semiconductor triode structure, a power transistor structure, a phototransistor structure, a bipolar transistor structure, or other transistor structures. When the transistor structure is an insulated gate bipolar transistor, the structure of the insulated gate bipolar transistor may be an anode short-circuit structure, a segmented anode structure, or a super junction structure.

In some embodiments, the insulating layer 240 may be formed on a surface of the emitter 222, and the bootstrap electrode 230 is formed on the insulating layer 240, such that the bootstrap capacitor may be formed by adding the insulating layer 240 and the bootstrap electrode 230 on the emitter 222, which is simple and convenient, does not need to adjust the structure of the transistor structure formed on the silicon substrate 210, and is easy to manufacture.

In other embodiments, a groove may be defined on the silicon substrate 210, the insulating layer 240 is formed on an inner wall of the groove, and the bootstrap electrode 230 is disposed in the groove, such that the insulating layer 240 and the bootstrap electrode 230 are arranged in the silicon substrate 210 by means of a groove in the silicon substrate 210. In this way, the size of the semiconductor device 200 may be reduced and the integration degree may be improved.

Furthermore, the number of grooves is at least two, and a bootstrap electrode 230 is arranged in each groove. At least two bootstrap electrodes 230 in the at least two grooves are connected in series, such that by defining the at least two grooves with bootstrap electrodes 230 and insulating layers 240 inside on the silicon substrate 210, the charge space volume of the bootstrap electrode 230 may be increased, thereby increasing the capacity of the bootstrap capacitor.

In other embodiments, the groove may be defined through the emitter 222, and the emitter 222 may be divided into a first sub-emitter and a second sub-emitter by the groove. The first sub-emitter and the second sub-emitter are connected in series. The groove is defined through the emitter 222, and the first sub-emitter and the second sub-emitter separated by the groove are connected in series to increase the charge space volume of the bootstrap electrode 230 in the groove, thereby increasing the capacity of the bootstrap capacitor.

In some embodiments, a first sub-doped region and a second sub-doped region may be further formed on the silicon substrate 210, and the first sub-doped region and the second sub-doped region are separated by the groove. The first sub-doped region is connected to the first sub-emitter, and the second sub-doped region is connected to the second sub-emitter. By arranging the first sub-doped region and the second sub-doped region respectively connected with the first sub-emitter and the second sub-emitter, the first sub-doped region and the second sub-doped region may be configured as charge spaces, thereby increasing the charge space volume of the electrode at one end of the bootstrap capacitor, further increasing the capacity of the bootstrap capacitor. Among them, the transistor structure may include the first sub-doped region and the second sub-doped region. In this way, it may only be necessary to define the groove on the silicon substrate 210 and arrange the insulating layer 240 and the bootstrap electrode 230 in the groove, such that the bootstrap capacitor is integrated into the semiconductor device 200. Of course, the area of the first sub-doped region and the second sub-doped region of the transistor structure may be appropriately increased to increase the charge space volume, thereby increasing the capacity of the bootstrap capacitor.

In some embodiments, the collector 223 may be disposed in the middle of the silicon substrate 210. The gate 221 may be arranged around the collector 223, and the emitter 222 and the bootstrap electrode 230 may be both arranged around the gate 221, such that the collector 223 and the gate 221 are surrounded by the emitter 222 and the bootstrap electrode 230. In this way, the presence of the bootstrap electrode 230 has no or little effect on the performance of the transistor structure on the silicon substrate 210.

Further, the bootstrap electrode 230 and the insulating layer 240 may be arranged on a periphery of the transistor structure, such that the bootstrap electrode 230 and the insulating layer 240 may not affect the flow of carriers (holes and current) in the transistor structure, and thus not affect the formation of a conductive channel in the transistor structure, which will not affect the performance of the transistor structure itself.

In the embodiments, an N-type drift region 224, a P-type body region 225, a P-type source region 226, an N-type source region 227, an N-type buffer region 228, a P-type drain region 229, and a medium layer 2211 may be formed on the silicon substrate 210. At least a part of a semiconductor doped region (the N-type drift region 224, P-type body region 225, P-type source region 226, N-type source region 227, N-type buffer region 228, and P-type drain region 229 may be referred to as the semiconductor doped region) may be made of the silicon substrate 210. Specifically, when the silicon substrate 210 is a silicon-on-insulator (SOI) substrate, at least a part of the semiconductor doped region is made of a top layer silicon 211. In addition, the N-type drift region 224, the P-type body region 225, the P-type source region 226, the N-type source region 227, the N-type buffer region 228, the P-type drain region 229, the medium layer 2211, the collector 223, the emitter 222, and the gate 221 may jointly form the transistor structure to achieve the performance of the transistor structure. Both the first sub-doped region and the second sub-doped region connected to the emitter 222 may be the P-type source region 226.

In some embodiments, the P-type source region 226 is arranged around the N-type drift region 224; the P-type body region 225 and the N-type buffer region 228 are arranged on the N-type drift region 224; the N-type source region 227 is arranged in the P-type body region 225; P-type drain region 229 is arranged in the N-type buffer region 228; the medium layer 2211 is arranged on the N-type drift region 224, the P-type body region 225, the N-type buffer region 228, the N-type source region 227, and the P-type drain region 229; the emitter 222 is arranged around the medium layer 2211; the gate 221 and the collector 223 are arranged in the medium layer 2211.

In other embodiments, when the silicon substrate 210 is an SOI substrate, the P-type body region 225 and the N-type buffer region 228 are disposed on a surface of the N-type drift region 224 away from the insulating layer 240. The P-type source region 226 is arranged around the N-type drift region 224. The N-type source region 227 is arranged on a surface of the P-type body region 225 away from the insulating layer 240. The P-type drain region 229 is arranged on a surface of the N-type buffer region 228 away from the insulating layer 240. The medium layer 2211 is arranged on a side of the N-type drift region 224, the P-type source region 226, the N-type source region 227, the P-type body region 225, the N-type buffer region 228, and the P-type drain region 229 away from the insulating layer 240. Among them, the collector 223, the emitter 222 and the gate 221 may all be disposed in the medium layer 2211.

Both the P-type source region 226 and the N-type source region 227 may be connected to the emitter 222. The collector 223 may be connected to the P-type drain region 229. The medium layer 2211 isolates the gate 221 from other parts of the transistor structure. In addition, an orthographic projection of the gate 221 on a plane of the insulating layer 240 and an orthographic projection of the P-type body region 225 on the plane of the insulating layer 240 may overlap with each other.

In the actual preparation process of the transistor structure, a method of ion implantation may be applied to dope corresponding type of substance in each region and control the corresponding doping concentration. P-type doped region (such as P-type body region 225, P-type source region 226, and P-type drain region 229) corresponding dopant material may contain boron, and N-type doped region (such as N-type drift region 224, N-type source region 227, N-type drain region, and N-type buffer region 228) corresponding dopant materials may contain arsenic or phosphorus. In other embodiments, the P-type source region 226 may be disposed on a surface of the P-type body region 225 away from the insulating layer 240, and the arrangement of other components of the transistor structure may not be changed.

In some embodiments, the semiconductor device 200 may adopt a layout structure in the form of a racetrack, such that no waste of chip area in the center area will occur. In this case, the groove may also be racetrack-shaped, and the groove may be arranged around the center of the semiconductor device.

Of course, in other embodiments, the semiconductor device 200 may also adopt a layout structure in the form of a regular polygon or a ring. In this case, the groove may also have a regular polygonal shape or a ring shape, and the groove may be arranged around the center of the semiconductor device.

In some embodiments, the ratio of the capacitance of the bootstrap capacitor to the capacitance of the gate 221 may be greater than 10 times. Therefore, the size, doping concentration, etc. of the electrodes at both ends of the bootstrap capacitor may be determined through the capacity ratio relationship.

Figure 4:
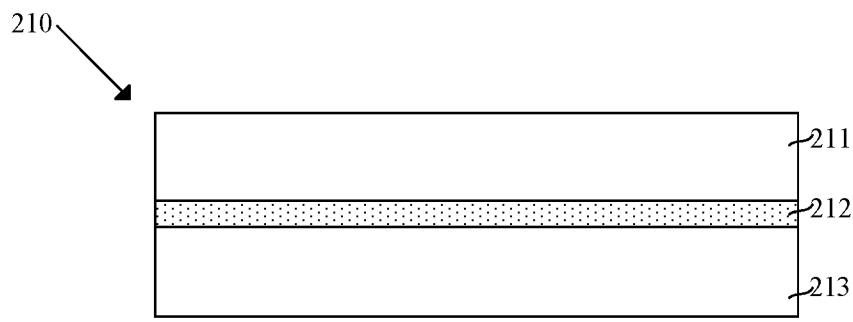
FIG. 4 is a structural schematic view of a silicon substrate of a semiconductor device according to some embodiments of the present disclosure.

In some embodiments, as shown in FIG. 4, the silicon substrate 210 may be an SOI substrate. The SOI substrate may include the top silicon 211, an insulating buried layer 212, and a substrate silicon 213. The bootstrap electrode 230, the insulating layer 240, the emitter 222, the gate 221, and the collector 223 may all be formed on the top silicon 211. Of course, the top silicon 211 may be configured as a device fabrication layer, and the transistor structure may be prepared through the top silicon 211. The insulating buried layer 212 may be a buried oxide layer. In other embodiments, the silicon substrate 210 may be a monocrystalline silicon wafer or a polycrystalline silicon wafer.

In some embodiments, the semiconductor device 200 may further include a first metal connection member and a second metal connection member. The first metal connection member and the second metal connection member are respectively configured to connect the emitter 222 and the bootstrap electrode 230 with rest components (which may be semiconductor components) are connected. The first metal connection member is connected to the emitter 222. The second metal connection member is connected to the bootstrap electrode 230. The insulating layer 240 may be disposed between the first metal connection member and the second metal connection member, and be configured to separate the first metal connection member from the second metal connection member and serve as an insulating medium between the first metal connection member and the second metal connection member, which is configured to form the bootstrap capacitor together with the first metal connection member and the second metal connection member.

Figure 5:
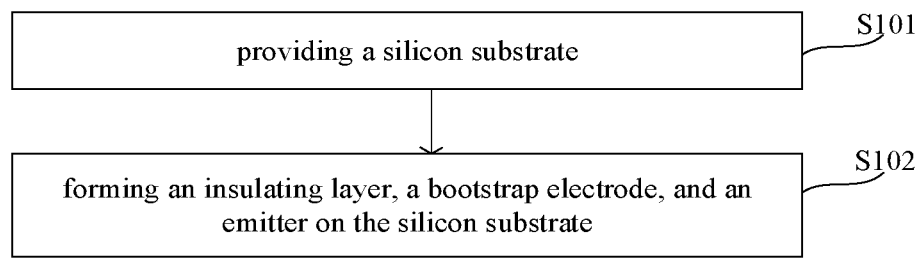
FIG. 5 is a flowchart of a preparation method for a semiconductor device according to some embodiments of the present disclosure.

As shown in FIG. 5, the present disclosure also provides a preparation method for the above-mentioned semiconductor device. The preparation method for the semiconductor device includes operations S101 and S102 at blocks illustrated in FIG. 5.

At block S101: providing a silicon substrate.

In some embodiments, the silicon substrate may include a first silicon layer, an insulating layer, and a second silicon layer that are sequentially stacked. The silicon substrate may be an SOI substrate prepared by SOI technology, and the insulating layer may be an insulating buried layer in the SOI substrate.

Of course, the silicon substrate may alternatively be a single crystal silicon wafer and a polycrystalline silicon wafer.

At block S102: forming an insulating layer, a bootstrap electrode, and an emitter on the silicon substrate.

In some embodiments, before the forming an insulating layer, a bootstrap electrode, and an emitter on the silicon substrate, the method may include: etching the silicon substrate to define a groove; and forming a doped region by doping the silicon substrate (which may be performed on a region on the silicon substrate adjacent to the groove) by tilted ion implantation. The forming an insulating layer, a bootstrap electrode, and an emitter on the silicon substrate may include: insulating an inner wall of the groove to form the insulating layer; filling a conductive material (which may be conductive polysilicon or conductive metal) into the groove to form the bootstrap electrode; etching the doped region to form an emitter window, and filling a conductive material in the emitter window to form the emitter.

The insulating an inner wall of the groove may include: oxidizing or nitriding the inner wall of the groove to form the insulating layer. Alternatively, the insulating an inner wall of the groove may include: laying the insulating layer on the inner wall of the groove.

Of course, in other embodiments, the forming an insulating layer, a bootstrap electrode, and an emitter on the silicon substrate may include: forming the emitter on the silicon substrate (wherein a transistor structure may be prepared when the emitter is formed on the silicon substrate, or the transistor structure may be prepared after the emitter is formed on the silicon substrate); forming the insulating layer on the emitter; and forming the bootstrap electrode on the insulating layer.

Figure 6:
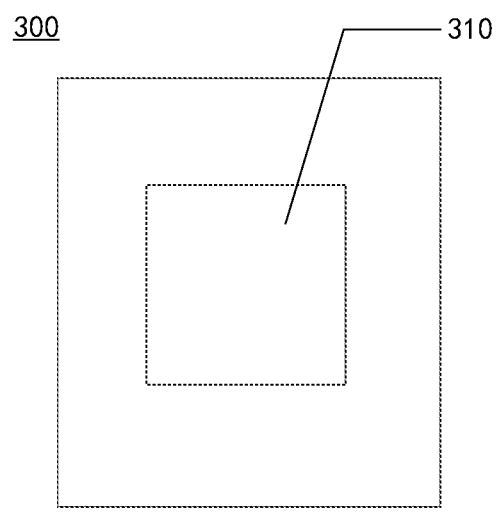
FIG. 6 is a structural schematic view of an electrical equipment according to some embodiments of the present disclosure.

Referring to FIG. 6, which is a structural schematic view of an electrical equipment 300 according to some embodiments of the present disclosure. The electrical equipment 300 includes the above-mentioned semiconductor device 310. The electrical appliance 300 may be a household appliance, such as a washing machine, a dishwasher, an electric cooker, an electric pressure cooker, an electric cooker, or an oven.

The above are only implementations of the present disclosure, and do not limit the scope of the present disclosure. Any equivalent structure or equivalent process transformation made using the content of the description and drawings of the present disclosure, or directly or indirectly applied to other related technical fields, is included in the scope of the present disclosure.

What is claimed is:

1. A semiconductor device, comprising:
    a silicon substrate, wherein an emitter, a gate, and a collector are formed on the silicon substrate;
    a bootstrap electrode, formed on the silicon substrate; and
    an insulating layer, formed on the silicon substrate and disposed between the emitter and the bootstrap electrode; wherein a bootstrap capacitor is formed between the emitter and the bootstrap electrode, wherein a groove is defined on the silicon substrate, the insulating layer is formed on an inner wall of the groove, and the bootstrap electrode is disposed in the groove.

2. The semiconductor device according to claim 1, wherein the groove comprises a plurality of grooves, and the bootstrap electrode comprises a plurality of bootstrap electrodes; each bootstrap electrode is arranged in a corresponding groove; at least two bootstrap electrodes in at least two grooves are connected in series.

3. The semiconductor device according to claim 1, wherein the groove is defined through the emitter, and the emitter is divided into a first sub-emitter and a second sub-emitter by the groove; the first sub-emitter and the second sub-emitter are connected in series.

4. The semiconductor device according to claim 3, wherein a first sub-doped region and a second sub-doped region are further formed on the silicon substrate, and the first sub-doped region and the second sub-doped region are separated by the groove; the first sub-doped region is connected to the first sub-emitter, and the second sub-doped region is connected to the second sub-emitter.

5. The semiconductor device according to claim 1, wherein the collector is disposed in the middle of the silicon substrate; the gate is arranged around the collector, and the emitter and the bootstrap electrode are both arranged around the gate.

6. The semiconductor device according to claim 1, wherein an N-type drift region, a P-type body region, a P-type source region, an N-type source region, an N-type buffer region, a P-type drain region, and a medium layer are further formed on the silicon substrate.

7. The semiconductor device according to claim 6, wherein:
    the P-type source region is arranged around the N-type drift region;
    the P-type body region and the N-type buffer region are arranged on the N-type drift region;
    the N-type source region is arranged in the P-type body region;
    the P-type drain region is arranged in the N-type buffer region;
    the medium layer is arranged on the N-type drift region, the P-type body region, the N-type buffer region, the N-type source region, and the P-type drain region;
    the emitter is arranged around the medium layer;
    the gate and the collector are arranged in the medium layer; and
    the P-type source region and the N-type source region are connected to the emitter; the collector is connected to the P-type drain region; at least a part of the N-type drift region, P-type body region, P-type source region, N-type source region, N-type buffer region, and P-type drain region is made of the silicon substrate.

8. The semiconductor device according to claim 6, wherein the silicon substrate is a silicon-on-insulator substrate:
    the P-type body region and the N-type buffer region are disposed on a surface of the N- type drift region away from the insulating layer;
    the P-type source region is arranged around the N-type drift region;
    the N-type source region is arranged on a surface of the P-type body region away from the insulating layer;
    the P-type drain region is arranged on a surface of the N-type buffer region away from the insulating layer;
    the medium layer is arranged on a side of the N-type drift region, the P-type source region, the N-type source region, the P-type body region, the N-type buffer region, and the P-type drain region away from the insulating layer;
    the collector, the emitter, and the gate are disposed in the medium layer; and
    the P-type source region and the N-type source region are connected to the emitter; the collector is connected to the P-type drain region; at least a part of the N-type drift region, P-type body region, P-type source region, N-type source region, N-type buffer region, and P-type drain region is made of the silicon substrate.

9. An electrical equipment, comprising a semiconductor device:
    wherein the semiconductor device comprises:
        a silicon substrate, wherein an emitter, a gate, and a collector are formed on the silicon substrate;
        a bootstrap electrode, formed on the silicon substrate; and an insulating layer, formed on the silicon substrate and disposed between the emitter and the bootstrap electrode; wherein a bootstrap capacitor is formed between the emitter and the bootstrap electrode, wherein a groove is defined on the silicon substrate, the insulating layer is formed on an inner wall of the groove, and the bootstrap electrode is disposed in the groove.

10. The electrical equipment according to claim 9, wherein the groove comprises a plurality of grooves, and the bootstrap electrode comprises a plurality of bootstrap electrodes; each bootstrap electrode is arranged in a corresponding groove; at least two bootstrap electrodes in at least two grooves are connected in series.

11. The electrical equipment according to claim 9, wherein the groove is defined through the emitter, and the emitter is divided into a first sub-emitter and a second sub-emitter by the groove; the first sub-emitter and the second sub-emitter are connected in series.

12. The electrical equipment according to claim 11, wherein a first sub-doped region and a second sub-doped region are further formed on the silicon substrate, and the first sub-doped region and the second sub-doped region are separated by the groove; the first sub-doped region is connected to the first sub-emitter, and the second sub-doped region is connected to the second sub-emitter.

13. The electrical equipment according to claim 9, wherein the collector is disposed in the middle of the silicon substrate; the gate is arranged around the collector, and the emitter and the bootstrap electrode are both arranged around the gate.

14. The electrical equipment according to claim 9, wherein an N-type drift region, a P-type body region, a P-type source region, an N-type source region, an N-type buffer region, a P-type drain region, and a medium layer are further formed on the silicon substrate.

15. The electrical equipment according to claim 14, wherein:
the P-type source region is arranged around the N-type drift region;
the P-type body region and the N-type buffer region are arranged on the N-type drift region;
the N-type source region is arranged in the P-type body region;
the P-type drain region is arranged in the N-type buffer region;
the medium layer is arranged on the N-type drift region, the P-type body region, the N- type buffer region, the N-type source region, and the P-type drain region;
the emitter is arranged around the medium layer;
the gate and the collector are arranged in the medium layer; and
the P-type source region and the N-type source region are connected to the emitter; the collector is connected to the P-type drain region; at least a part of the N-type drift region, P-type body region, P-type source region, N-type source region, N-type buffer region, and P-type drain region is made of the silicon substrate.

* * * * *